United States Patent
Crowley et al.

(10) Patent No.: US 6,847,208 B1
(45) Date of Patent: Jan. 25, 2005

(54) TUBE ARRAY COIL FOR QUADRUPOLE RESONANCE (QR) SCANNING

(75) Inventors: Christopher Williams Crowley, San Diego, CA (US); Mitsuaki Arakawa, San Diego, CA (US); Simon Peter Beevor, Poway, CA (US)

(73) Assignee: Quantum Magnetics, Inc., San Diego, CA (US)

( * ) Notice: Subject to any disclaimer, the term of this patent is extended or adjusted under 35 U.S.C. 154(b) by 0 days.

(21) Appl. No.: 10/651,657

(22) Filed: Aug. 29, 2003

(51) Int. Cl.[7] .................................................. G01V 3/00
(52) U.S. Cl. ...................................... 324/300; 324/307
(58) Field of Search ................................. 324/300, 307, 324/309, 318, 321, 322, 243

(56) References Cited

U.S. PATENT DOCUMENTS

| | | | |
|---|---|---|---|
| 5,592,083 A | * | 1/1997 | Magnuson et al. ......... 324/300 |
| 5,986,455 A | * | 11/1999 | Magnuson ................... 324/318 |
| 6,268,724 B1 | * | 7/2001 | Crowley ...................... 324/243 |
| 6,288,724 B1 | | 7/2001 | Kumar et al. |
| 6,291,994 B1 | * | 9/2001 | Kim et al. ................... 324/300 |
| 6,392,408 B1 | * | 5/2002 | Barrall et al. ............... 324/300 |
| 6,594,338 B2 | | 1/2003 | Magnuson |

* cited by examiner

*Primary Examiner*—Brij Shrivastav
(74) *Attorney, Agent, or Firm*—The Maxham Firm (57) ABSTRACT

An inspection system including a radio frequency (RF) subsystem and a quadrupole resonance (QR) tube array coil. The RF subsystem may include a variable frequency RF source to provide RF excitation signals at a frequency generally corresponding to predetermined, characteristic QR frequencies of a specimen. The QR tube array coil may be implemented using a plurality of conductive tubes defining a cavity of predetermined volume. Typically, the plurality of conductive tubes are spaced at a distance relative to one another to form at least two non-conductive gaps between tubes in the array. After RF excitation signals are applied to the specimen within the cavity, the QR tube array coil may generate a QR output signal responsive to QR signals generated by the specimen.

32 Claims, 5 Drawing Sheets

TUBE ARRAY COIL FOR QUADRUPOLE RESONANCE (QR) SCANNING

BACKGROUND OF THE INVENTION

1. Field of the Invention

The present invention relates generally to an inspection system, and in particular to a inspection system for detecting explosives and contraband using a nuclear quadrupole resonance (NQR) tube array coil.

2. Discussion of the Related Art

Presently, the detection of contraband substances may be accomplished using a variety of different inspection and detection systems implementing technologies such as nuclear magnetic resonance (NMR), thermal neutron analysis (TNA), X-ray, and nuclear quadrupole resonance. Although each of these technologies may be useful in many applications, they all have limitations of varying degrees. For example, one drawback of NMR is that it requires relatively large magnets, which are somewhat expensive and could damage magnetically recorded material.

Although TNA based systems can detect nitrogen in most forms, these systems are susceptible to false alarms triggered by nitrogen-rich nylon and wool, and other innocuous items. X-ray screening, commonly used in airports, does not have the same overall limitations as TNA. However, many X-ray screening systems are unable to automatically alert an operator to the presence of explosives or drugs since these types of systems simply provide images that the operator must interpret.

In prior NQR testing systems, a sample is placed within a radio frequency (RF) coil, and is typically irradiated with pulses or sequences of pulses of electromagnetic radiation having a frequency which is at or very close to one or more resonance frequencies of the quadrupolar nuclei in a substance which is to be detected. If the substance is present, the irradiating energy will generate a precessing magnetization which can induce voltage signals in a detection coil adjacent the sample at the resonance frequency, and which can be detected as a free induction decay during a decay period after each pulse, or as an echo after two or more pulses.

Conventional NQR systems typically implement a sheet coil that is shaped and configured to define a cavity for receiving a sample to be screened. While such sheet coil configurations have enjoyed considerable success in many respects, the sheet configuration of the RF coil inhibits or prevents the use of additional or auxiliary sensor systems. NQR systems comprising RF coils that facilitate cooperation with auxiliary sensor systems have not previously been known.

SUMMARY OF THE INVENTION

The inspection system of the present invention includes a RF subsystem and a QR tube array coil. The RF subsystem may include a variable frequency RF source to provide RF excitation signals at a frequency generally corresponding to predetermined, characteristic NQR frequencies of a specimen. The QR tube array coil may be implemented using a plurality of conductive tubes defining a cavity of predetermined volume. Typically, the plurality of conductive tubes are spaced at a distance relative to one another to form at least two non-conductive gaps between tubes in the array. After RF excitation signals are applied to the specimen within the cavity, the QR tube array coil may generate an output signal responsive to NQR signals generated by the specimen.

In accordance with one aspect of the present invention, vertical excitation and detection coils may be configured with the QR tube array coil. The vertical excitation and detection coils may be respectively used for introducing and detecting magnetic flux along a vertical axis, relative to a specimen. Alternatively or additionally, horizontal excitation and detection coils may be configured with the QR tube array coil. The horizontal excitation and detection coils may be respectively used for introducing and detecting magnetic flux along a horizontal axis, relative to a specimen. If desired, axial excitation and detection coils may also be configured with the QR tube array coil to replace or supplement the vertical and horizontal coils. The axial excitation and detection coils may be respectively used for introducing and detecting magnetic flux along an axial axis, relative to a specimen.

In accordance with another aspect of the present invention, a predetermined shift in the NQR coil tune frequency is responsive to conductive portions of the specimen detectable along an axial axis of the specimen.

BRIEF DESCRIPTION OF THE DRAWING

The above and other aspects, features and advantages of the present invention will become more apparent upon consideration of the following description of preferred embodiments taken in conjunction with the accompanying drawing figures, wherein.

DETAILED DESCRIPTION OF THE PREFERRED EMBODIMENTS

In the following description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention.

As a matter of convenience, many embodiments of the invention will be described in the context of a baggage inspection system implemented as part of a typical aviation security system. Particular reference will be made to "baggage" which is screened for explosives and other threat objects. However, it is to be understood that the present invention is not so limited and that many other applications are envisioned and possible within the teachings of this invention. Examples of particular applications of baggage inspection systems that may also be implemented include seaports, public buildings, public transportation facilities, prisons, hospitals, power plants, office buildings, hotels, and casinos, among others. Furthermore, the terms "baggage" and "specimen" are used herein to generally define items that may be screened by the inspection system of the present invention and which may contain, or be constructed of, various types of explosive materials. Possible types of baggage and specimens include, for example, passenger baggage, checked baggage, parcels, mail, packages, containers, cargo, vehicles, people, laptop or portable computers, and the like.

Figure 1:
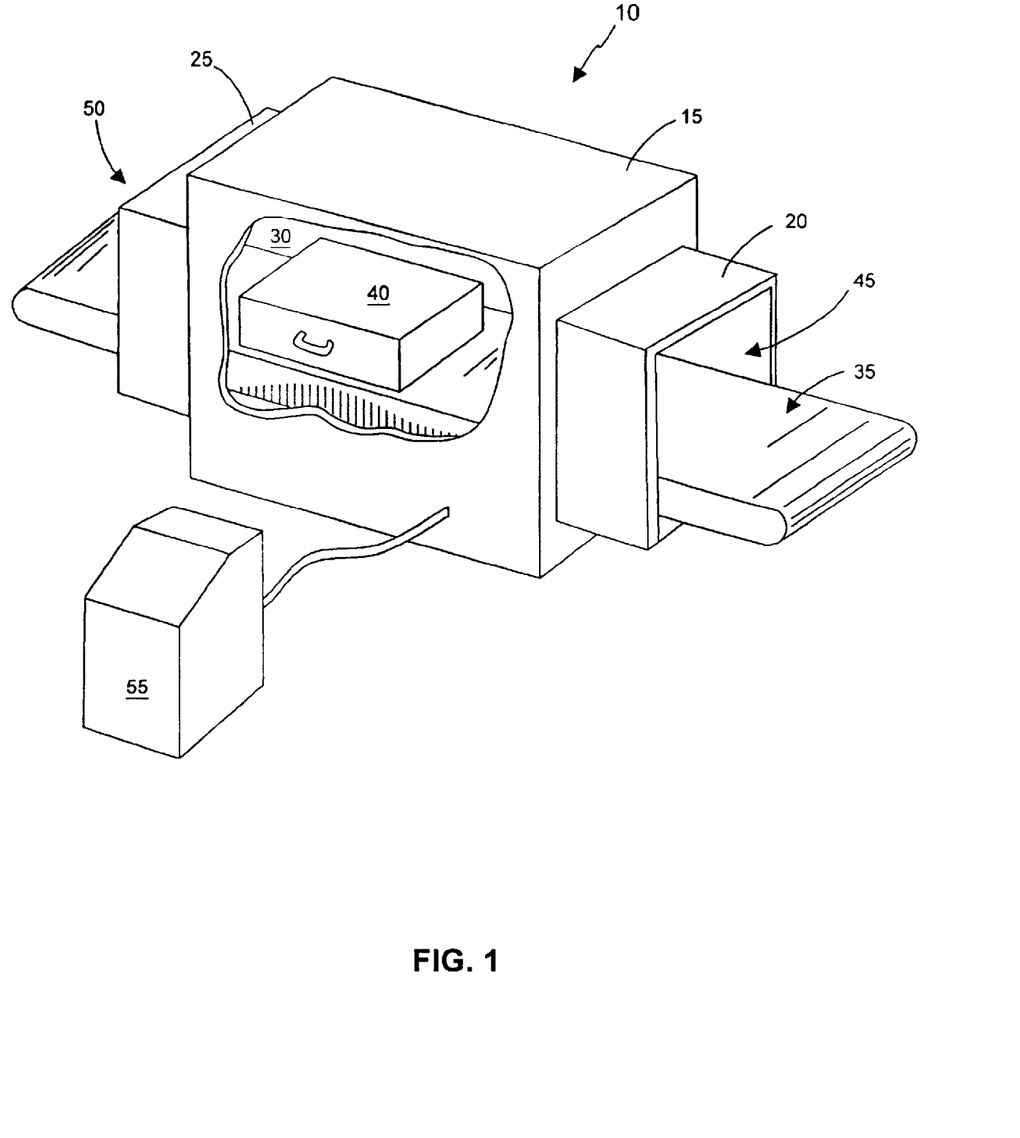
FIG. 1 is a perspective view of a typical scanning unit that may be configured with a QR tube array coil in accordance with the invention.

FIG. 1 is a perspective view of scanning unit 10, which may be configured with a QR tube array coil in accordance with the invention. The scanning unit generally includes housing 15 configured with entrance and exit shielding 20 and 25. The housing is shown partially broken away to illustrate scanning tunnel 30. A suitable device, such as conveyor 35, may be used for introducing baggage 40 into the scanning tunnel via tunnel entrance 45. After scanning, the conveyor may carry the inspected baggage out of the scanning tunnel via tunnel exit 50.

The entrance and exit shielding is typically implemented to provide the various RF coils and detectors within the scanning unit with electromagnetic interference (EMI) and radio frequency interference (RFI) shielding, as may be required or desired. At the same time, the entrance and exit shielding structure inhibits RFI from escaping from the specimen testing cavity within the scanning tunnel. Techniques for providing such shielding are well known in the art and need not be further described.

Console 55 is shown in communication with the scanning unit and is typically used to control and monitor the various systems operating in conjunction with the scanning unit, as will be described in more detail herein.

Figure 2:
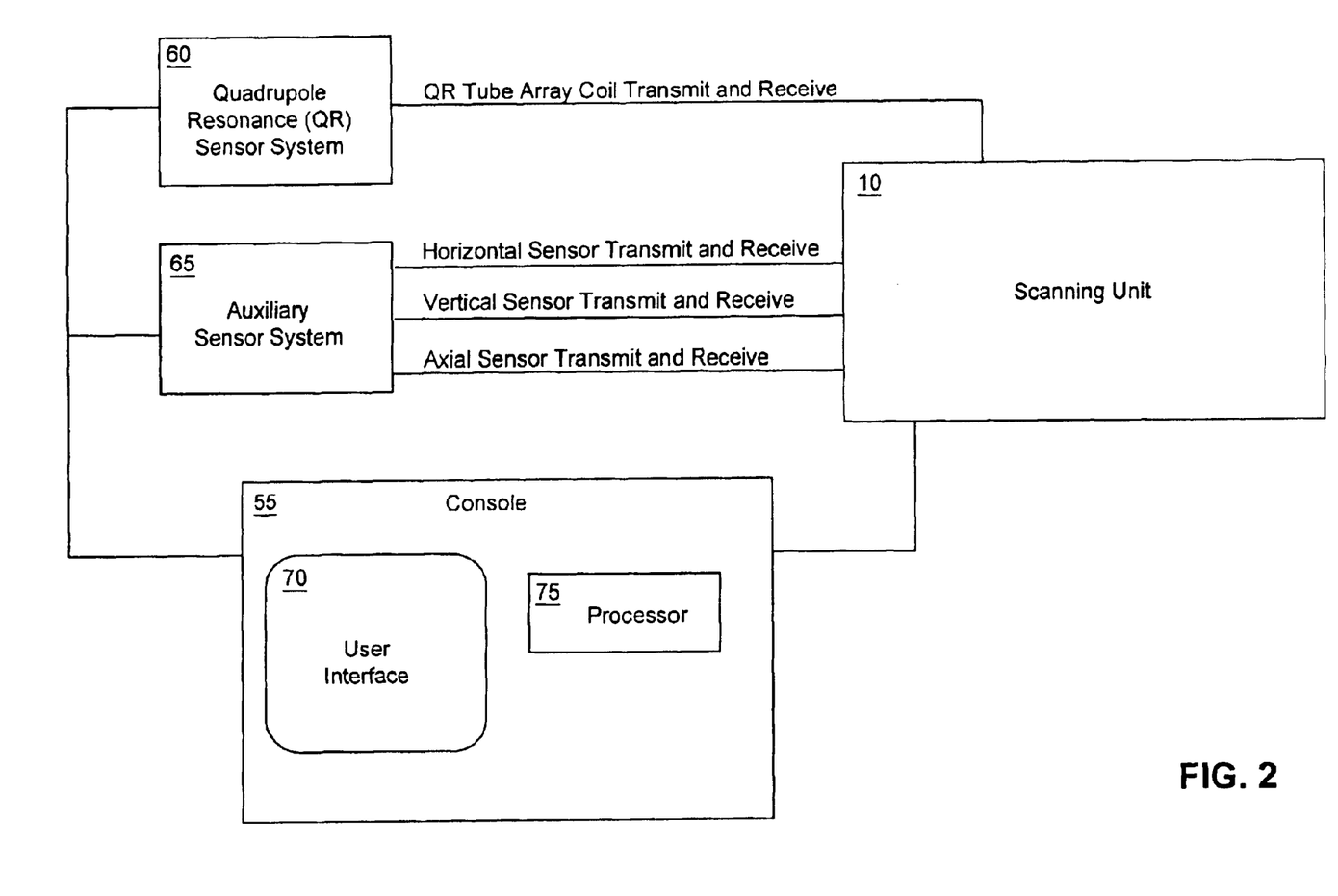
FIG. 2 is a block diagram showing several system components in communication with the scanning unit.
Figure 3A:
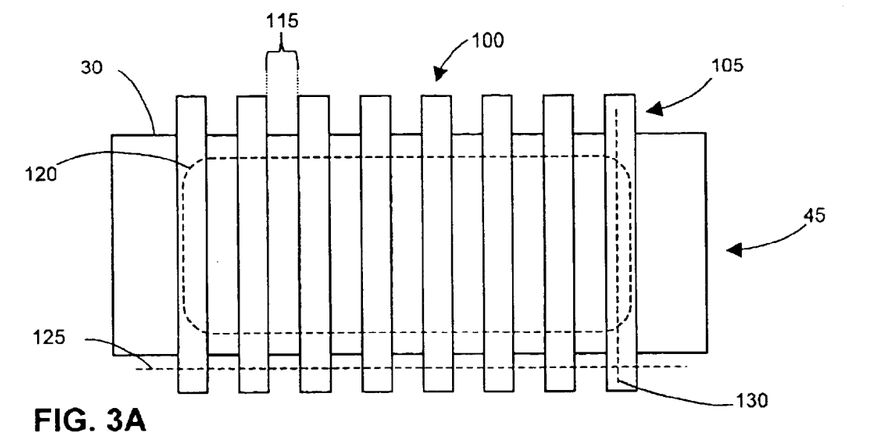
FIGS. 3A–3C respectively show top, side, and end views of a typical QR tube array coil configured with a conventional scanning tunnel, in accordance with some embodiments of the present invention.
Figure 3B:
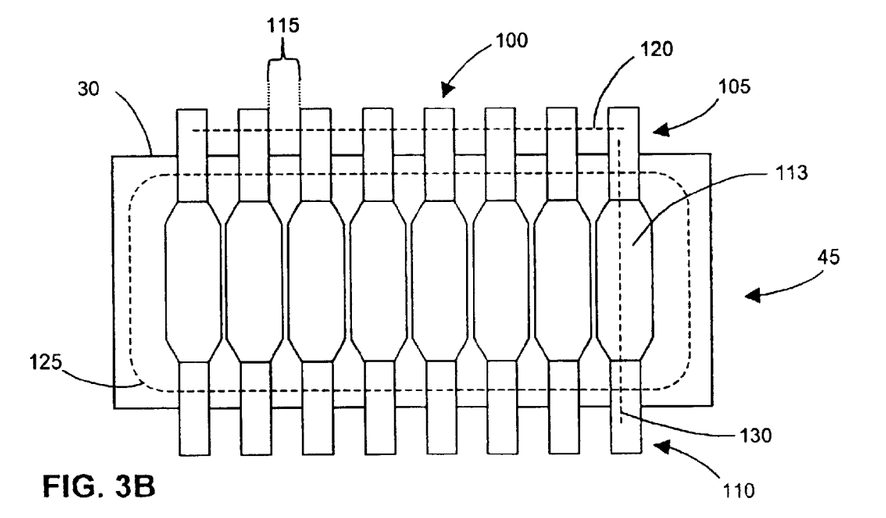
Figure 3C:
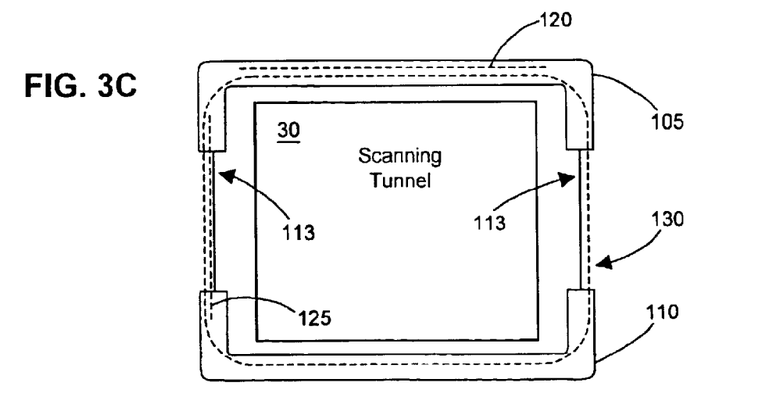

FIG. 2 is a block diagram showing several system components in communication with scanning unit 10. In this figure, QR sensor system 60 and auxiliary sensor system 65 are coupled with the scanning unit. In particular, the QR sensor system is in RF communication with a QR tube array coil contained within the scanning unit, while the auxiliary sensor system is in RF communication with three excitation and detection coils within the scanning unit.

Console 55 may be implemented to control and monitor the operation of the QR and auxiliary sensor systems, as well as the various systems residing within the scanning unit. The console may be configured with user interface 70 and processor 75. The processor may be implemented using any suitable computational device that provides the necessary control, monitoring, and data analysis of the various systems associated with the scanning unit. In general, the processor may be a specific or general purpose computer such as a personal computer having an operating system such as DOS, Windows, OS/2 or Linux; Macintosh computers; computers having JAVA OS as the operating system; graphical workstations such as the computers of Sun Microsystems and Silicon Graphics, and other computers having some version of the UNIX operating system such as AIX or SOLARIS of Sun Microsystems; or any other known and available operating system, or any device including, but not limited to, laptops and hand-held computers. The user interface may be any suitable display device operable with any of the computing devices described herein and may comprise a display device such as an LCD, LED, CRT, plasma monitor, and the like.

The communication link between the console and the QR sensor system, auxiliary sensor system, and the scanning unit may be implemented using any suitable technique that supports the transfer of information as may be required by the present invention. For example, the communication link may be implemented using conventional communication technologies such as UTP, Ethernet, coaxial cables, serial or parallel cables, and optical fibers, among others. Although the use of wireless communication technologies is possible, they are typically not utilized since they may not provide the necessary level of security required by many applications such as airport baggage screening systems.

In many implementations, console 55 is physically configured in close physical proximity to the scanning unit, but the console may be remotely implemented if so desired. Remote implementations may be accomplished by configuring the console and scanning unit with a suitably secure network link that comprises anything from a dedicated connection, to a local area network (LAN), to a wide area network (WAN), to a metropolitan area network (MAN), or even to the Internet.

QR sensor system 60 may be implemented using a conventional QR sheet coil system configured to detect the presence of explosives in passenger baggage using nuclear quadrupole resonance (NQR), as modified in accordance with the invention to accommodate a QR tube array coil. An appropriately configured QR sensor system and associated QR tube array coil can detect a wide range of explosives such as Semtex, C-4, nitroglycerin, PETN, RDX, Detasheet, TNT, Tetryl, ANFO, black powder, and the like. If desired, the QR sensor system may be easily configured with additional screening capabilities for detecting illegal drugs such as cocaine, heroin, and MDMA, among others.

NQR is a branch of radio frequency spectroscopy that has been used for the detection of explosives and drugs. NQR exploits the inherent electrical properties of atomic nuclei. Nuclei with non-spherical electric charge distributions possess electric quadrupole moments. In solid materials, electrons and atomic nuclei produce electric field gradients. These electric field gradients interact with the nuclear quadrupole moments of quadrupolar nuclei, producing energy levels for the quadrupolar nuclei, and hence their characteristic transition frequencies. Measurements of these frequencies, or relaxation time constants, or both, can indicate not only which nuclei are present but also their chemical environment.

In operation, using carefully tuned pulses of low intensity electromagnetic waves, a quadrupole resonance device probes the molecular structure of targeted items such as explosives and narcotics. The effects of quadruple resonance momentarily disturb the alignment of target nuclei within the item scanned. As the nuclei realign themselves, they emit a characteristic signal of their own, which is picked up by a receiver and sent to a computer for rapid analysis. The signal emitted by each type of explosive or illegal drug is unique. Specialized RF pulse sequences have been developed for optimal detection of particular explosives and illegal drugs such as cocaine and heroin. RF signal production and the detection of NQR return signals may be accomplished using, for example, the techniques disclosed in U.S. Pat. No. 5,592,083, assigned to Quantum Magnetics, Inc., of San Diego, Calif.

In general, QR sensor system 60 comprises a RF subsystem in communication with a QR tube array coil. Using well known techniques, the RF subsystem may utilize a variable frequency RF source to provide RF excitation signals at a frequency generally corresponding to a predetermined, characteristic NQR frequency of a specimen. During scanning, the RF excitation signals generated by the RF source may be introduced into the specimen. In accordance with the invention, the QR tube array coil may serve as a pickup coil for NQR signals generated by the specimen, thus providing an NQR output signal.

Auxiliary sensor system 65 may be optional ly implemented to augment the detection capabilities of the QR tube array coil controlled by QR sensor system 60. The auxiliary sensor system may include sensor systems such as additional QR sensors, ultrasound, X-ray, magnetic field generating and detection coils, and the like.

For example, in some embodiments, the auxiliary sensor system may include three mutually orthogonal, excitation coil windings. In operation, each of the excitation coils applies RF magnetic fields along three separate, orthogonal axes (relative to a specimen) referred to herein as horizontal, vertical, and axial axes. The auxiliary sensor system may further include three detection coils corresponding to the three excitation coils. The three detection coils may be formed so their sensitivity coincides with the axis of a magnetic field generated by an associated excitation coil. That is, the three detection coils may be configured to detect magnetic flux along the horizontal, vertical, and axial axes.

The three excitation and detection coils may be formed and positioned using a variety of different techniques. For example, each excitation coil may be physically intertwined with an associated detection coil to form a single coil. In this configuration, the excitation and detection coils geometrically coincide. Another technique is where excitation and detection coil windings are configured in such a manner that they physically occupy the same general area on or within the QR tube array coil, but are not actually intertwined. Another possible alternative is where the excitation and detection coils are placed along opposing sides of the QR tube array coil, as will be described in more detail with respect to FIGS. 5A–5C.

For convenience, many embodiments will be described herein where the auxiliary sensor system is implemented using RF excitation and detection coils for generating and detecting magnetic flux, but those of ordinary skill will realize that other sensor systems may be implemented within the teachings of the present invention.

Figure 4:
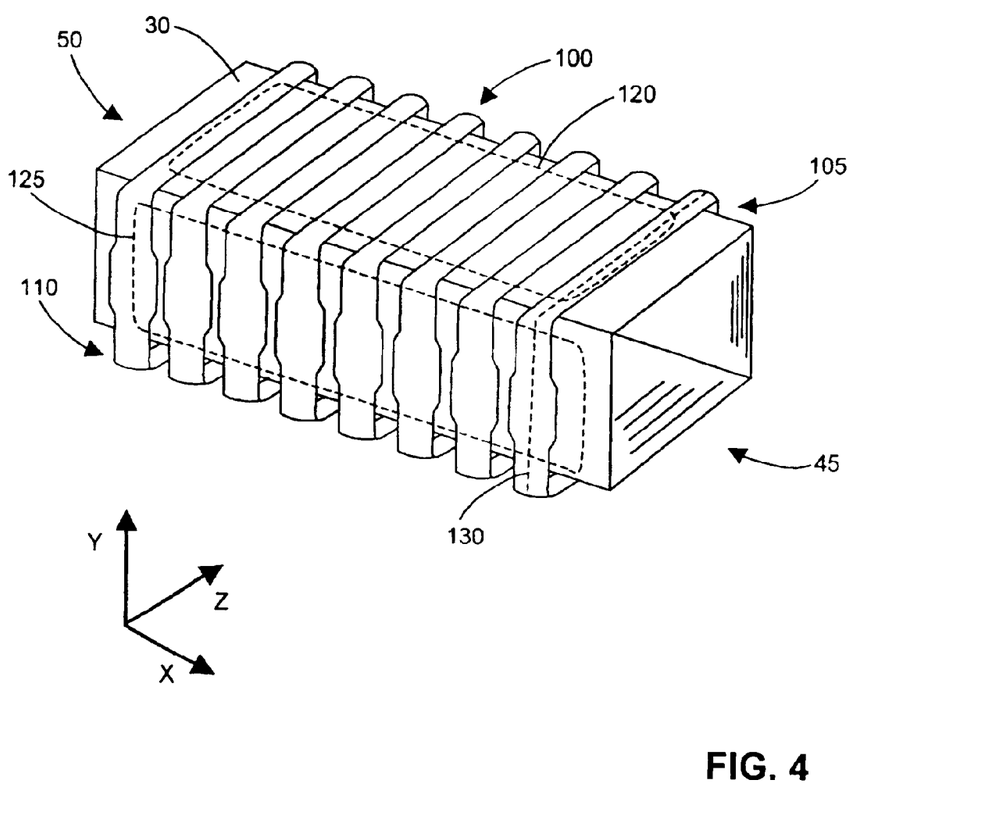
FIG. 4 is a perspective view of a typical QR tube array coil configured with a conventional scanning tunnel, in accordance with some embodiments of the present invention.

FIGS. 3A, 3B, 3C, and 4 show a typical QR tube array coil configured with a standard scanning tunnel. In particular, FIGS. 3A–3C respectively show top, side, and end views of QR tube array coil 100, while FIG. 4 shows a perspective view of the QR tube array coil. The scanning tunnel may be formed with any suitable material, such as wood or plastic, that permits the interrogation of baggage items by the QR tube array coil and any auxiliary sensors that may be used. The scanning tunnel is shown in a rectangular configuration, but other designs (circular, oval, for example) may be implemented if so desired.

The QR tube array coil of QR sensor system 60 may be implemented using an array of "conductive elements." This array of conductive elements may be configured using a plurality of individual conductive tubes of any practical geometric shape (circular, rectangular, oval, and the like). Alternatively, the array of conductive elements may be formed with individual, open channel structural elements (U-channel, V-channel, parabolic, among others), or as flat or substantially flat conductive structures, or with other structural configurations that permit the introduction of RF signals into a scanning tunnel. The individual conductive elements may be formed from any suitable conductive material such as copper, aluminum, and silver, among others.

The array of conductive elements are typically formed entirely of conductive materials, but other configurations are possible where the individual conductive elements are configured with portions of non-conductive materials. For example, each of the array of conductive elements may be formed on the inside and/or outside of a non-conductive element. A particular example may be where the outside surface of a non-conductive tube is configured with a suitable conductive material. Alternatively or additionally, the inside surface of the non-conductive plastic tube may be configured with conductive material. These alternative configurations may be implemented to reduce the overall weight of the tube array coil, to facilitate the manufacture of uniquely shaped coil arrays, or to enhance the structural integrity of the individual elements of the tube array.

Application of conductive materials to a nonconductive element may be achieved using known techniques. For example, hardened conductive sheet materials may be affixed to the non-conductive element. Alternatively, the conductive material may be applied to the non-conductive element as a coating. For convenience, the present invention will be described with respect to a QR tube array coil formed from conductive "tubes," but it is to be understood that the principles disclosed herein apply equally to conductive elements of different geometries, as well as to tube array coils formed using conductive materials configured with non-conductive elements.

Referring still to FIGS. 3A, 3B, 3C, and 4, QR tube array coil 100 may include a series of tubes having upper and lower portions 105, 110 joined by conductive bracket 113. The QR tube array coil is shown formed with eight individual tubes that may be uniformly spaced, defining gap 1115 between adjacent tubes. In the illustrated embodiment, the eight individual tubes comprising QR tube array coil 100 define seven discrete, non-conductive gaps. The non-conductive gaps formed by the individual tubes of the QR tube array coil permit the use of auxiliary sensors in conjunction with the QR sensor system.

For example, in accordance with some embodiments of the present invention, the QR tube array coil may be configured with vertical coil 120, which is shown positioned along upper portion 105 of the QR tube array coil; horizontal coil 125, which is shown positioned along one side of the QR tube array coil; and axial coil 130, which is shown positioned within a single tube of the QR tube array coil, near scanning tunnel entrance 45. Each of the vertical, horizontal, and axial coils are shown passing through the various tubes of the QR tube array coil, but other configurations are possible where each of these coils are alternatively placed above or below the QR tube array coil, or where the coils are woven above and below the QR tube array coil in alternating fashion.

In some embodiments, vertical coil 120 may include excitation and detection windings respectively configured to introduce and detect magnetic flux along a vertical axis (Y-axis) within the scanning tunnel, as shown in FIG. 4. Similarly, horizontal coil 125 may include excitation and detection windings respectively configured to introduce and detect magnetic flux along a horizontal axis (Z-axis) within the scanning tunnel, while axial coil 130 may include excitation and detection winding respectively configured to introduce and detect magnetic flux along an axial axis (X-axis).

The horizontal and vertical coils are shown occupying a substantial portion of the QR tube array coil. This configuration is often utilized to maximize the effective magnetic field generated and detected by the excitation and detection coils comprising the horizontal and vertical coils. However, the actual coil size and shape of the horizontal and vertical coils may be modified to accommodate the requirements of a particular application.

No particular spacing configuration for the individual tubes comprising the QR tube array coil is required or desired. Any practical design configuration may be utilized as long as non-conductive gaps are formed between adjacent tubes of the QR tube array coil. For example, if the individual tubes comprising the QR tube array coil are spaced too closely, they may effectively form a conductive sheet, which may prohibit or inhibit the introduction of magnetic flux, for example, into the scanning tunnel. Accordingly, the tubes of the QR tube array coil should be arranged so that the distance between adjacent tubes permits the operation of auxiliary sensors, such as the horizontal, vertical, and axial coils.

The QR tube array coil is shown having eight individual conductive tubes defining seven non-conductive gaps. However, the present invention is not so limited and as few as three tubes, to as many as 100 tubes, or more, may be used if so desired. A specific, non-limiting example of a possible design for the QR tube array coil is where eight individual copper tubes, having an inside diameter of about 1.5 inches and an approximate thickness of 0.050 inches, are positioned on 3 inch centers along the length of the scanning tunnel. In this configuration, the individual tubes of the QR tube array coil define approximate 1.5 inch, non-conductive gaps.

The overall size of the QR tube array coil may be modified to accommodate a particular application. This may be accomplished by modifying the size or number of the individual components of the QR tube array coil. For example, each tube of the QR tube array coil may be positioned on 2.5 inch centers along the length of the scanning tunnel to define approximate 1 inch, non-conductive gaps. Another alternative may be to reduce the number of individual tubes to create, for example, four or five non-conductive gaps.

Operation of an inspection system in accordance with some embodiments of the present invention may proceed as follows. First, baggage 40 may be placed on conveyor 35 and advanced into scanning tunnel 30 so that the bag is within the scanning tunnel, and thus within the cavity defined by QR tube array coil 100. Next, the bag is QR-scanned by QR sensor system 60 by providing RF excitation signals at a frequency generally corresponding to a predetermined, characteristic NQR frequency of a target specimen. The QR tube array coil may then detect any NQR signals from the target specimen to generate a NQR output signal that is communicated to processor 75. A typical QR scanning process requires about 2–20 seconds per bag.

In some embodiments, after the QR scanning process is completed, the QR tube array coil may be "switched" off to permit additional scanning by auxiliary sensor system 65. For example, each of the excitation coils of the vertical, horizontal, and axial coils 120, 125 and 130 may be sequentially energized to respectively induce magnetic flux along vertical, horizontal, and axial axes. Signals induced in each of the detection coils (vertical, horizontal, and axial) may then be detected and measured in known fashion. Once again, the presence of non-conductive gaps formed by the individual tubes of the QR tube array coil enables the use of auxiliary sensors in conjunction with the QR sensor system.

Many variations to the previously described embodiments are contemplated and within the teachings of the present invention. For example, the QR tube array coil may be configured with only one or two auxiliary coils, in contrast to the three-coil design shown in the figures. A specific example may be where the QR tube array coil is configured with the vertical coil. This particular implementation may be used whenever interrogation along a single axis (vertical axis) is desired. Of course, a single auxiliary coil design may alternatively be implemented using either of the horizontal or axial coils. Another alternative may be where a combination of two coils is used. This design may be accomplished using any of the following coil combinations: horizontal and vertical; horizontal and axial; and vertical and axial.

Still yet another possibility may be to use the QR tube array coil for axial measurements, thus replacing the axial coil. In this configuration, QR flux in the QR tube array coil may be detected by recording shifts in the QR tune frequency. A particular example may be where the frequency of operation of the QR tube array coil may be about 1 MHz, and the field strength is about 0.1 Gauss, for example.

Another alternative for obtaining measurements with an auxiliary coil would be to implement the QR tube array coil using individual conductive elements configured with portions of non-conductive materials, as previously described. A specific example may be where the inside and outside surfaces of a non-conductive tube are separately coated with a suitable conductive material. In this configuration, the inside conductive surface may be controlled by QR sensor system 60, while the outside conductive surface may be controlled by auxiliary sensor system 65. In this particular example, the inside portion of the tube forms a QR coil, and the outside portion forms the auxiliary coil (for example, axial coil 130). Of course, these coils may be switched so that the outside portion of the tube forms the QR coil, a nd the inside portion forms the auxiliary coil.

Figure 5A:
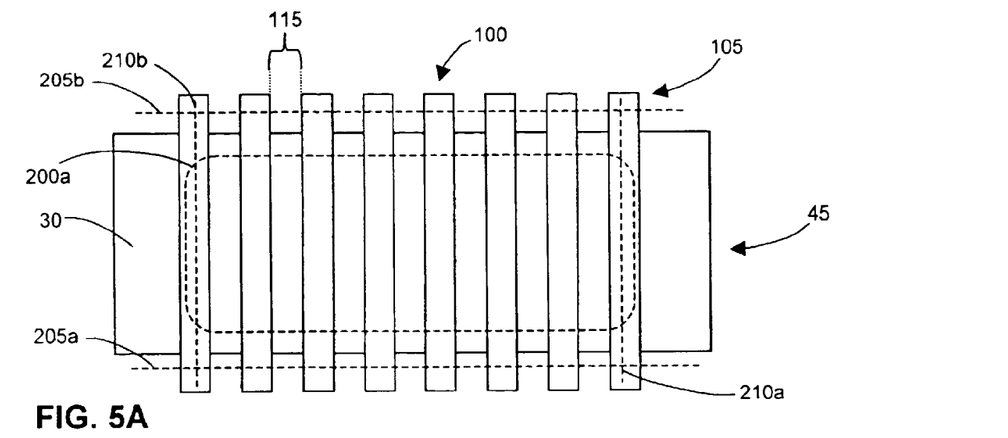
FIGS. 5A–5C respectively show top, side, and end views of a typical QR tube array coil having auxiliary sensors arranged in an opposing configurations.
Figure 5B:
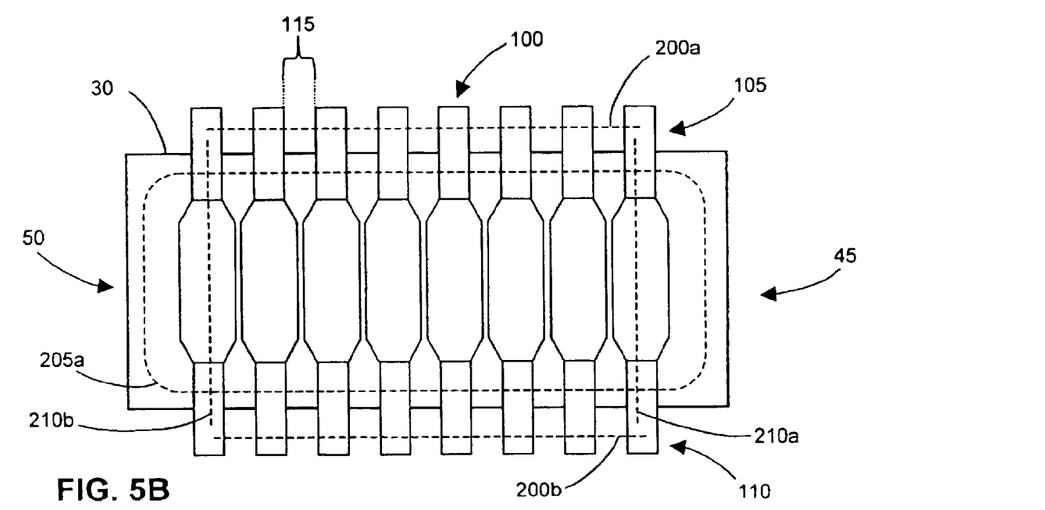
Figure 5C:
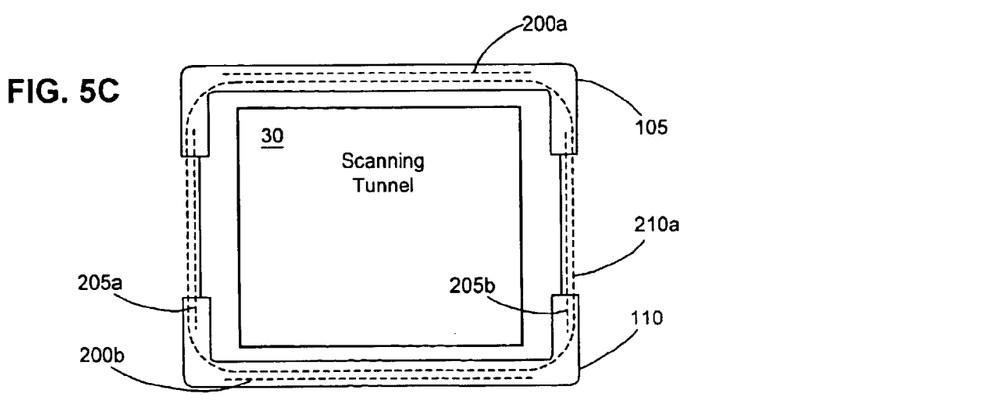

FIGS. 5A–5C respectively show top, side, and end views of QR tube array coil 100 configured with excitation and detection coils implemented in opposing fashion. This sensor configuration contrasts with the geometrically coinciding, auxiliary sensor coil implementation depicted in FIGS. 3A–3C.

In FIGS. 5A–5C, the QR tube array coil is shown configured with vertical excitation coil 200a positioned along upper portion 105 of the QR tube array coil, and associated vertical detection coil 200b positioned along opposing lower portion 110. Horizontal excitation coil 205a is shown positioned on one side of the QR tube array coil, and horizontal detection coil 205b is shown positioned along an opposing side of the QR tube array coil. Axial excitation coil 210a is shown positioned within a single tube of the QR tube array coil, near scanning tunnel entrance 45, while axial detect ion coil 210b is shown positioned within a single tube near scanning tunnel exit 50. Operation of the QR tube array coil and associated auxiliary sensors may proceed in a fashion similar to the other embodiments.

While the invention has been described in detail with reference to disclosed embodiments, various modifications within the scope of the invention will be apparent to those of ordinary skill in this technological field. It is to be appreciated that features described with respect to one embodiment typically may be applied to other embodiments. Therefore, the invention properly is to be construed with reference to the claims.

What is claimed is:

1. An inspection system comprising:
   a radio frequency (RF) subsystem comprising a variable frequency RF source to provide RF excitation signals at a frequency generally corresponding to predetermined, characteristic nuclear quadrupolar resonant (NQR) frequency of a specimen; and a plurality of conductive elements configured as a conductive element array defining a cavity of predetermined volume, wherein each of said plurality of conductive elements is spaced at a distance relative to one another to form at least two non-conductive gaps, said RF excitation signals from said RF source being applied to said specimen within said cavity, said conductive element array functioning as a pickup coil for NQR signals from said specimen and providing an NQR output signal.

2. The system according to claim 1, said system further comprising:

a first excitation coil for introducing magnetic flux into said specimen along a first axis relative to said specimen; and a first detection coil for receiving said magnetic flux along said first axis, wherein said first excitation coil and said first detection coil are configured with said conductive element array.

3. The system according to claim 2, wherein said first excitation coil is configured with said conductive element array at a first location, and said first detection coil is configured with said conductive element array at a second location for receiving said magnetic flux along said first axis when said specimen is inside said cavity and between said first excitation coil and said first detection coil.

4. The system according to claim 2, wherein said first excitation coil and said first detection coil geometrically coincide.

5. The system according to claim 2, said system further comprising:

a second excitation coil for introducing magnetic flux into said specimen along a second axis relative to said specimen; and a second detection coil for receiving said magnetic flux along said second axis, wherein said second excitation coil and said second detection coil are configured with said conductive element array, and wherein said first and second axes of said magnet flux are orthogonal.

6. The system according to claim 5, said system further comprising:

a third excitation coil for introducing magnetic flux into said specimen along a third axis relative to said specimen; and a third detection coil for receiving said magnetic flux along said third axis, wherein said third excitation coil and said third detection coil are configured with said conductive element array, and wherein said first, second, and third axes of said magnet flux are orthogonal.

7. The system according to claim 6, wherein each of said first, second, and third excitation and detection coils are at least partially wound through some or all of said plurality of conductive elements defining said conductive element array.

8. The system according to claim 6, wherein said third excitation coil is configured with said conductive element array at a first location, and said third detection coil is configured with said conductive element array at a second location for receiving said magnetic flux along said third axis when said specimen is inside said cavity and between said third excitation coil and said third detection coil.

9. The system according to claim 6, wherein said third excitation coil and said third detection coil geometrically coincide.

10. The system according to claim 5, wherein a predetermined shift in tune frequency of said pickup coil is responsive to conductive portions of said specimen detectable along an axial axis of said specimen.

11. The system according to claim 5, wherein a predetermined shift in tune frequency of said pickup coil is responsive to conductive portions of said specimen detectable along any axis of said specimen.

12. The system according to claim 5, wherein said second excitation coil and said second detection coil geometrically coincide.

13. The system according to claim 5, wherein said second excitation coil is configured with said conductive element array at a first location, and said second detection coil is configured with said conductive element array at a second location for receiving said magnetic flux along said second axis when said specimen is inside said cavity and between said second excitation coil and said second detection coil.

14. The system according to claim 1, wherein each of said plurality of conductive elements is tubular.

15. The system according to claim 1, wherein each of said plurality of conductive elements comprises open channels.

16. The system according to claim 1, wherein each of said plurality of conductive elements is substantially flat.

17. The system according to claim 1, wherein each of said plurality of conductive elements comprises a copper tube.

18. The system according to claim 1, wherein said distance between conductive elements of said conductive element array is at least 1 inch.

19. The system according to claim 1, wherein said conductive element array comprises at least five conductive elements to form at least four non-conductive gaps.

20. The system according to claim 1, wherein said conductive element array comprises at least eight conductive elements to form at least seven non-conductive gaps.

21. The system according to claim 1, wherein each of said plurality of conductive elements are separately formed on a surface of a non-conductive structural element.

22. The system according to claim 1, wherein each of said plurality of conductive elements are separately formed over exposed surfaces of a non-conductive structural element.

23. The system according to claim 1, wherein each of said plurality of conductive elements are separately formed on an inside surface of a tubular, non-conductive structural element.

24. The system according to claim 1, wherein each of said plurality of conductive elements are separately formed on an outside surface of a tubular, non-conductive structural element.

25. The system according to claim 1, said system further comprising:

a first excitation coil for introducing magnetic flux into said specimen along a first axis relative to said specimen; and a first detection coil for receiving said magnetic flux along said first axis, wherein each of said plurality of conductive elements are separately formed on one surface of a non-conductive structural element, wherein additional conductive material is formed on a second surface of said non-conductive structural element, and wherein said first detection and excitations coils are configured with said additional conductive material formed on said second surface of said non-conductive structural element.

26. A method for inspecting a specimen comprising:

providing radio frequency RF excitation signals using a variable frequency RF source, wherein said RF excitation signals are at a frequency generally corresponding to predetermined, characteristic nuclear quadrupolar resonant (NQR) frequency of the specimen; and generating an NQR output signal using a plurality of conductive elements configured as a conductive element array defining a cavity of predetermined volume, wherein each of said plurality of conductive elements is spaced at a distance relative to one another to form at least two non-conductive gaps, said RF excitation signals from said RF source being applied to said specimen within said cavity, said conductive element array functioning as a pickup coil for NQR signals from said specimen.

27. The method according to claim 26, said method further comprising:

introducing magnetic flux into said specimen along a first axis relative to said specimen using a first excitation coil; and receiving said magnetic flux along said first axis using a first detection coil, wherein said first excitation coil and said first detection coil are configured with said conductive element array.

28. The method according to claim 27, said method further comprising:

introducing magnetic flux into said specimen along a second axis relative to said specimen using a second excitation coil; and receiving said magnetic flux along said second axis using a second detection coil, wherein said second excitation coil and said second detection coil are configured with said conductive element array, and wherein said first and second axes of said magnet flux are orthogonal.

29. The method according to claim 28, said method further comprising:

introducing magnetic flux into said specimen along a third axis relative to said specimen using a third excitation coil; and receiving said magnetic flux along said third axis using a third detection coil, wherein said third excitation coil and said third detection coil are configured with said conductive element array, and wherein said first, second, and third axes of said magnet flux are orthogonal.

30. The method according to claim 28, wherein a predetermined shift in tune frequency of said pickup coil is responsive to conductive portions of said specimen detectable along an axial axis of said specimen.

31. The method according to claim 28, wherein a predetermined shift in tune frequency of said pickup coil is responsive to conductive portions of said specimen detectable along any axis of said specimen.

32. A method for inspecting a specimen comprising:

means for providing radio frequency (RF) excitation signals at a frequency generally corresponding to predetermined, characteristic nuclear quadrupolar resonant (NQR) frequency of a specimen; and means for generating an NQR output signal using a plurality of conductive elements configured as a conductive element array defining a cavity of predetermined volume, wherein each of said plurality of conductive elements is spaced at a distance relative to one another to form at least two non-conductive gaps, said RF excitation signals being applied to said specimen within said cavity, said conductive element array functioning as a pickup coil for NQR signals from said specimen.

* * * * *